(12) United States Patent  (10) Patent No.: US 7,894,063 B2
Van Bilsen et al.            (45) Date of Patent:    Feb. 22, 2011

(54) LITHOGRAPHIC METHOD

(75) Inventors: Franciscus Bernardus Maria Van Bilsen, Eindhoven (NL); Everhardus Cornelis Mos, Best (NL)

(73) Assignee: ASML Netherland B.V., Veldhoven (NL)

( * ) Notice: Subject to any disclaimer, the term of this patent is extended or adjusted under 35 U.S.C. 154(b) by 305 days.

(21) Appl. No.: 12/258,707

(22) Filed: Oct. 27, 2008

(65) Prior Publication Data

US 2009/0128832 A1 May 21, 2009

Related U.S. Application Data

(60) Provisional application No. 60/996,203, filed on Nov. 6, 2007.

(51) Int. Cl.
*G01B 11/00* (2006.01)
(52) U.S. Cl. .................... 356/401; 355/53; 355/55; 700/121; 438/401
(58) Field of Classification Search ......... 356/399–401, 356/614–623; 438/401; 700/121, 95; 355/53, 355/55
See application file for complete search history.

(56) References Cited

U.S. PATENT DOCUMENTS

| 7,362,446 | B2* | 4/2008 | Van Der Pasch et al. .... 356/499 |
| 7,415,319 | B2* | 8/2008 | Werkman et al. ........... 700/121 |
| 2008/0024748 | A1* | 1/2008 | Zaal et al. .................. 355/72 |
| 2010/0123886 | A1* | 5/2010 | Bijnen et al. ................ 355/53 |

* cited by examiner

*Primary Examiner*—Hoa Q Pham
(74) *Attorney, Agent, or Firm*—Sterne, Kessler, Goldstein & Fox P.L.L.C

(57) ABSTRACT

A method includes determining relative positional relationships between applied fields on a substrate, one of the applied fields including a first field; in a lithographic apparatus, using an alignment apparatus to obtain at least one absolute positional relationship between the position of at least the first field of the substrate and a part of the lithographic apparatus; and determining an absolute positional relationship between at least one field, other than the first field, and a part of the lithographic apparatus using the relative positional relationships and the at least one obtained absolute relationship.

18 Claims, 6 Drawing Sheets

LITHOGRAPHIC METHOD

CROSS REFERENCE TO RELATED APPLICATIONS

This application claim priority under 35 U.S.C. §119(e) to U.S. Provisional Patent Application No. 60/996,203, filed Nov. 6, 2007, which is incorporated by reference herein in its entirety.

BACKGROUND

1. Field of the Invention

The present invention relates to a lithographic method.

2. Related Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., including part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning" direction) while synchronously scanning the substrate parallel or anti-parallel to this direction.

When a substrate has been exposed to radiation across its entire surface, it is provided with a plurality of exposed fields, or exposed images. It is often desirable to determine the positions of these fields with a high degree of accuracy. This is because a target portion of a substrate may be exposed to a radiation beam on a number of different occasions in order to, for example, add different layers to a device. In other words, fields may be applied to the substrate on top of one another (i.e., overlaid). If fields for a given target portion are not applied accurately on top of one another, a given device formed from such fields may not function as intended, or may not function at all. For example, it may well be that a field electrically connects one functional layer of the resultant device to another functional layer of the resultant device. If the successively applied layers are not applied accurately on top of one another, the electrical connections may not be made to the correct parts of the functional layers, meaning that the device may not function properly or at all. There is often some tolerance allowed with regard to how accurately successively applied fields can be positioned on top of one another while still resulting in an acceptable device, or other structure. This is often referred to as an overlay requirement.

As will be appreciated from the previous paragraph, as well as knowing the positions of fields previously applied to a substrate, it is also desirable to know accurately a subsequent field will be applied to the substrate. For this reason, in between the application of overlaid fields, positional properties of the substrate and/or the fields may be determined. For example, before the exposure of a set of overlaying fields, alignment marks on the substrate may be used to determine if the substrate has changed in size or in orientation between successive exposures. The positions of individual fields are not measured in this example, the assumption being that the lithographic apparatus is accurate enough to consistently apply fields with a sufficient degree of accuracy. However, this is not always the case, meaning that successively applied fields may not be sufficiently well aligned on top of one another. In another example, the positions of all of the fields previously applied to the substrate on or in a single layer may be accurately determined using alignment apparatus in the lithographic apparatus. Such determination is undertaken in order to try to ensure that all subsequently aligned fields are accurately aligned with previously applied fields. However, the determining of the position of each and every field of a substrate using alignment apparatus in the lithographic apparatus may be time consuming, and may reduce throughput.

SUMMARY

Therefore, what is needed is an effective system and method capable of determining the position of each field of a substrate using absolute and relative positional relationships.

In an embodiment of the present invention, there is provided a method including: determining relative positional relationships between applied fields on a substrate, one of the applied fields including a first field, in a lithographic apparatus, using an alignment apparatus to obtain at least one absolute positional relationship between the position of at least the first field of the substrate and a part of the lithographic apparatus. The method continues by determining an absolute positional relationship between at least one field, other than the first field, and a part of the lithographic apparatus using the relative positional relationships and the at least one obtained absolute relationship.

In another embodiment of the present invention, there is provided a method of manufacturing at least a part of a device, including: determining relative positional relationships between applied fields on a substrate, one of the applied fields including a first field, in a lithographic apparatus, using an alignment apparatus to obtain at least one absolute positional relationship between the position of at least the first field of the substrate and a part of the lithographic apparatus. The method continues by determining an absolute positional relationship between at least one field, other than the first field, and a part of the lithographic apparatus using the relative positional relationships and the at least one obtained absolute relationship, and applying an additional field, taking into account the determined absolute positions of the applied fields, to form at least a part of a device.

In a further embodiment of the present invention, there is provided at least a part of a device manufactured according to the method of manufacture aspect of another aspect of the present invention.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example only, with reference to the accompanying drawings in which corresponding reference symbols indicate corresponding parts. Further, the accompanying drawings, which are incorporated herein and form part of the specification, illustrate the present invention and, together with the description, further serve to explain the principles of the invention and to enable a person skilled in the relevant art(s) to make and use the invention.

Figure 1:
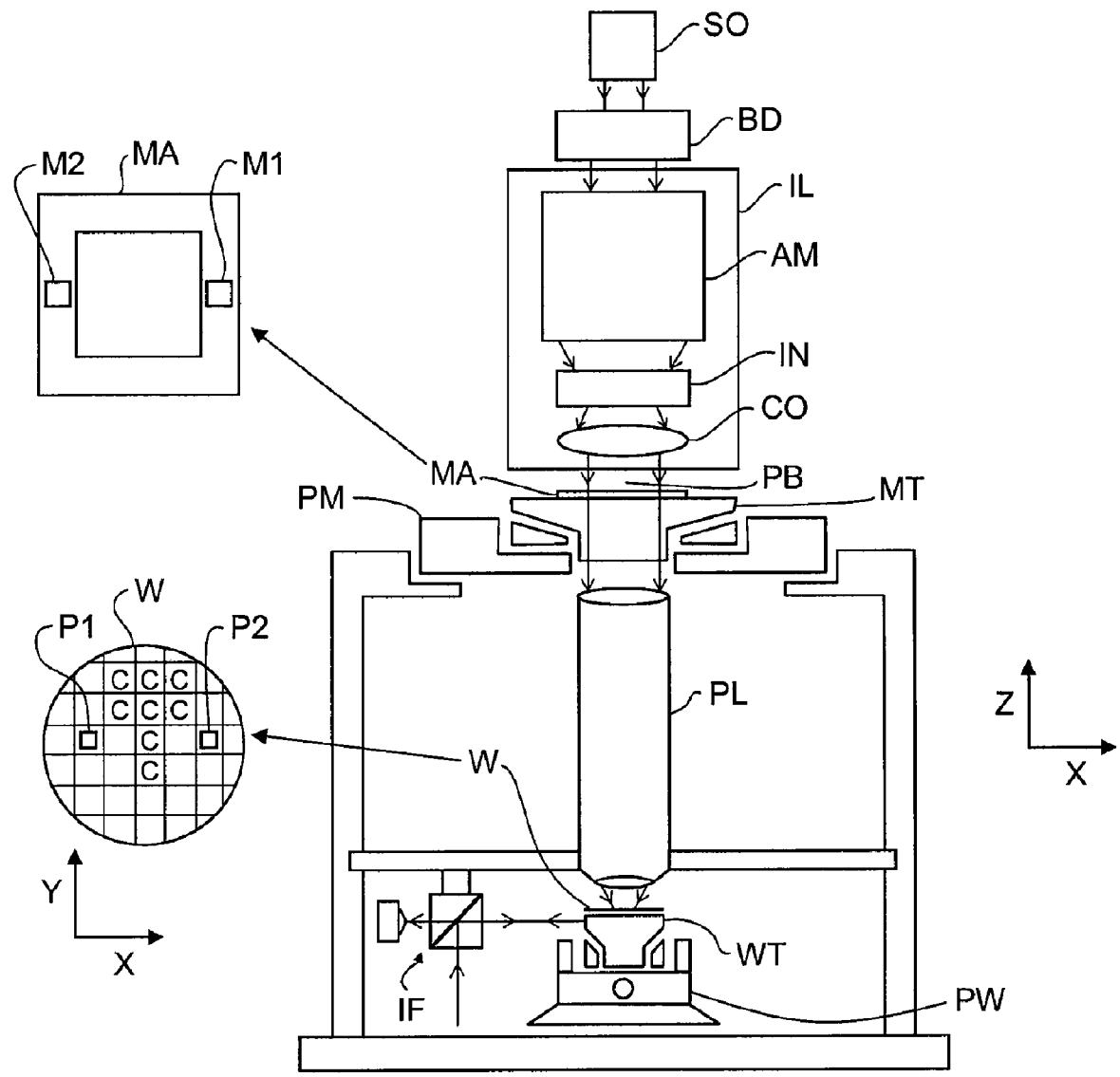
FIG. 1 depicts a lithographic apparatus in accordance with an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two, e.g., dual stage, or more substrate tables, and, for example two or more support structures. In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts a lithographic. The apparatus includes an illumination system (illuminator) IL to condition a beam PB of radiation (e.g., UV radiation, DUV radiation or EUV radiation); a support structure (e.g., a mask table) MT to support a patterning device (e.g., a mask) MA and connected to first positioning device PM to accurately position the patterning device with respect to item PL; a substrate table (e.g., a wafer table) WT for holding a substrate (e.g., a resist-coated wafer) W and connected to second positioning device PW for accurately positioning the substrate with respect to item PL; and a projection system (e.g., a refractive projection lens) PL configured to image a pattern imparted to the radiation beam PB by patterning device MA onto a target portion C (e.g., including one or more dies) of the substrate W.

In this embodiment, for example, the apparatus is of a transmissive type (e.g., employing a transmissive mask). Alternatively, the apparatus may be of a reflective type (e.g., employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusted AM for adjusting the angular intensity distribution of the beam. Generally, at least the outer and/or inner radial extent, which are commonly referred to as σ-outer and σ-inner, respectively, of the intensity distribution in a pupil plane of the illuminator can be adjusted. In addition, the illuminator IL generally includes various other components, such as an integrator IN and a condenser CO. The illuminator provides a conditioned beam of radiation PB, having a desired uniformity and intensity distribution in its cross-section.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
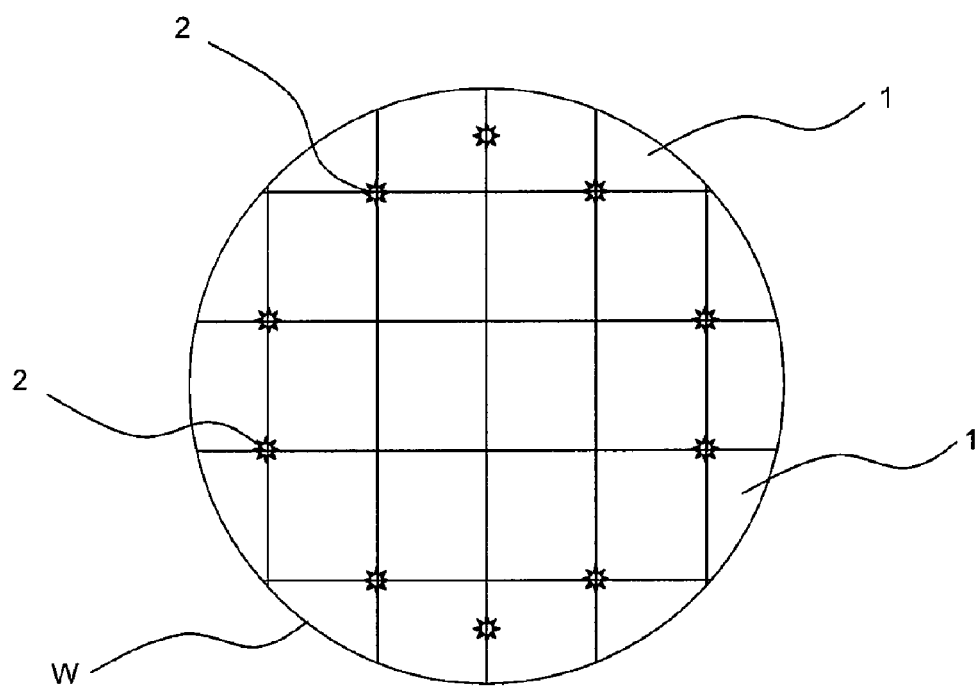
FIG. 2 depicts a substrate with alignment marks, according to an embodiment of the present invention.

FIG. 2, according to an embodiment of the present invention, depicts a substrate W. A plurality of fields 1 has been provided on the substrate W. Or, otherwise stated, a plurality of fields or images have been applied to the substrate W. Each field may contain one or more patterns, as known in the art. It can be seen that a plurality of alignment marks 2 are provided on the substrate W. It can be seen that the alignment marks 2 are not provided within the main body of the fields 1, but are instead provided in between the main bodies of adjacent fields 1, for example, in scribe lines or lanes.

As mentioned above, it is often desirable to ensure that successively applied fields are applied on top of one another to within a certain margin of error (e.g., such that an overlay requirement is met). As already mentioned, FIG. 2 depicts a substrate W provided with a plurality of fields 1. It may be desirable to apply an additional plurality or set of fields on top of the plurality of fields 1 previously applied. If so, it is desirable to determine the position of the previously applied fields 1 to ensure that successively applied fields are overlaid accurately. For example, by using an alignment apparatus provided in the lithographic apparatus, an absolute positional relationship between the alignment marks 2 on the substrate W and elements of the lithographic apparatus, for example, the alignment apparatus, may be obtained. The obtained relationships may be compared with previously or subsequently applied alignment marks to determine to what extent the substrate W has changed shape or orientation. For instance, it is possible to determine if the substrate has expanded, shifted into position, rotated slightly, etc. Information indicative of these changes in the shape and/or orientation of the substrate W may be fed back into the lithographic apparatus to ensure that these changes are taken into account during the application of subsequent fields to the substrate. This means that, in theory, subsequently applied fields will be accurately overlaid on top of previously applied fields 1. However, this method may not be reliable. This is because the positions of the alignment marks 2 are taken into account, and not the positions of the fields. This means that some fields may not actually have changed position as a consequence of, for example, warping of the substrate W. Nevertheless, if the alignment marks 2 have shifted sufficiently in position, subsequently applied fields may have a correction factor applied to them even though such a correction factor is not necessary.

In another embodiment, the absolute position of all of the fields 1 on the substrate W relative to a part of the lithographic apparatus may be determined by an alignment apparatus provided in the lithographic apparatus. This means that when subsequent fields are applied to the substrate W, they should be in properly aligned with previously applied fields 1. However, accurately determining the position of all previously applied fields on a substrate W may take a significant amount of time, for example, as when compared to time taken to applied fields to the substrate W, and therefore may have a significant impact on throughput.

Figure 3:
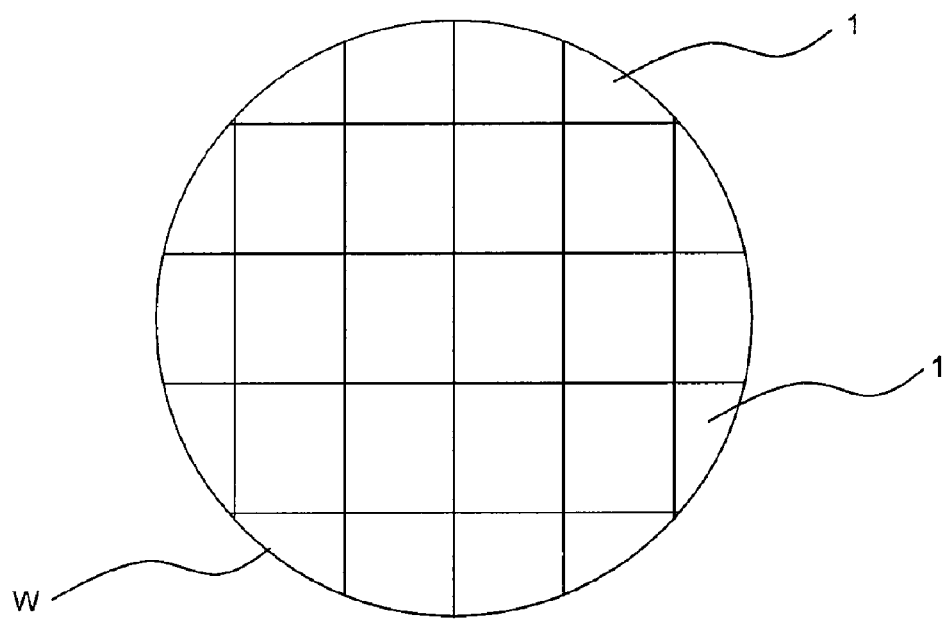
FIGS. 3-5 depict an alignment method, according to an embodiment of the present invention.

FIG. 3, according to an embodiment of the present invention, depicts a substrate W to which a plurality of fields 1 has been applied. Or, otherwise stated, a substrate W to which a plurality of images has been applied. According to an embodiment of the present invention, the relative position of these fields 1 to one another on the substrate W is measured using a dedicated metrology tool which may be located remote from or outside of the lithographic apparatus. That is, the relative positions of the fields 1 are not measured using alignment apparatus present inside the lithographic apparatus. This means that the throughput of the lithographic apparatus may not be affected by these measurements. The determined positions are deemed to be relative, since they are not measured in relation to any part of the lithographic apparatus, but instead are measured in relation to other fields 1. Once the relative positions of all other fields 1 on the substrate W have been determined, the substrate is loaded into the lithographic apparatus.

Figure 4:
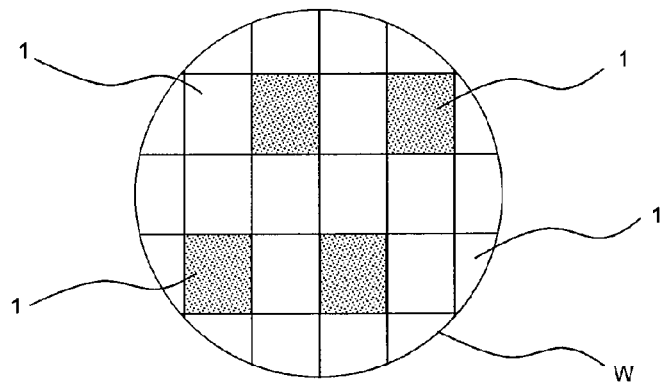

FIG. 4, according to an embodiment of the present invention, shows the substrate W when it has been loaded into the lithographic apparatus. When loaded in the lithographic apparatus, the absolute position of a number of fields 1 is obtained using alignment apparatus present in the lithographic apparatus. The fields 1 for which the absolute position is determined are shaded in the Figure. The term 'absolute' is used herein to indicate that the position of the shaded fields is now known relative to a part of the lithographic apparatus.

Figure 5:
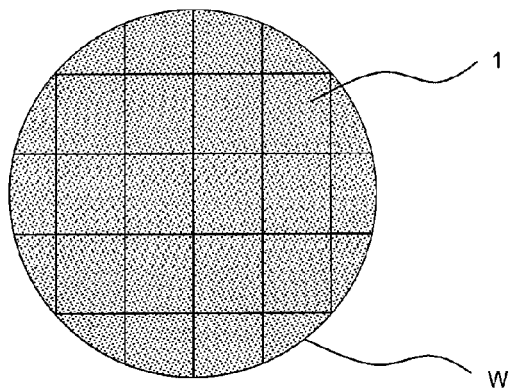

At this stage in the method, the relative positions of the fields 1 on the substrate W are known. Also known is the obtained absolute positions of a number of fields with reference to the lithographic apparatus. The absolute positions of the remaining fields 1 may be determined using the relative positional relationships determined by the metrology tool, and as described with reference to FIG. 3. That is, the obtained absolute positions of some of the fields may be used to put the relative positional relationships described with reference to FIG. 3 into context, thereby allowing the relative positional relationships to yield absolute positional relationships. It may be seen that in FIG. 5, all of the fields 1 are shaded, which means that the absolute positions of all of these fields 1 have been determined. Since the absolute positions of all of the fields 1 are known relative to the lithographic apparatus, further fields may be overlaid on top of these fields 1 in an accurate manner. Once the additional fields have been applied to the substrate, the substrate may be removed from the lithographic apparatus.

When remote or outside of the lithographic apparatus, the relative positions of the additional fields may be determined using the dedicated metrology tool, thereby not affecting the throughput of the lithographic apparatus. The relative positions determined by the metrology tool may be used to identify any errors present in the alignment of the additional overlying fields. Errors may arise for one of a number of reasons. For example, it may be seen in FIG. 4 that the absolute position of only a few fields is obtained. The absolute position of the remaining fields is determined using the relative positions of the fields as described in reference to FIG. 3. It could well be that in determining the absolute positions of the remaining fields, some assumptions or extrapolations need to be made. For instance, such assumptions or extrapolations may be desired to determine the absolute position of fields which are located one or more fields away from a field which has had its position obtained absolutely by alignment apparatus in lithographic apparatus. Any errors in these assumptions or extrapolations may thus be determined and fed back into calculations that are used to determine the absolute positions of all of the fields on the substrate in subsequent exposures. By doing this, subsequently applied fields may be overlaid more accurately on previously applied fields.

Figure 6A:
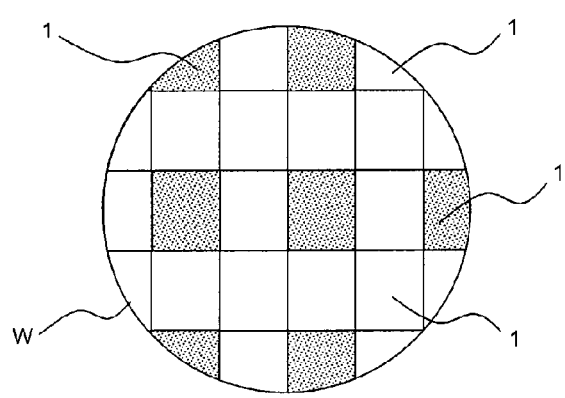
FIGS. 6a and 6b depict variations on apart of the method depicted in FIGS. 3-5, according to an embodiment of the present invention.
Figure 6B:
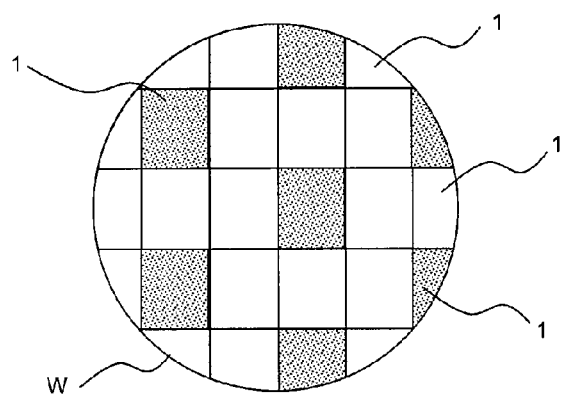

In FIG. 4, it can be seen that the position of a plurality of fields is obtained absolutely using alignment apparatus contained within the lithographic apparatus. It may be desirable to ensure that there is no more than one field spacing between fields whose position is obtained absolutely by the alignment apparatus in the lithographic apparatus. This may be desirable to ensure that there is as little assumptions and extrapolations made as possible when determining the absolute positions of all of the fields. FIGS. 6a and 6b depict alternatives in which the fields 1 whose position is obtained absolutely using the alignment apparatus of the lithographic are specifically chosen. They are chosen such that each field 1 whose position is not determined by the alignment apparatus shares a side or a corner with a field 1 whose position has been determined using the alignment apparatus of a lithographic apparatus. This means that fewer assumptions, extrapolations, etc., need to be made when determining the absolute positions of the remaining fields using the relative positional relationships together with the few absolute positional relationships, obtained using the alignment apparatus, as a reference.

Figure 7:
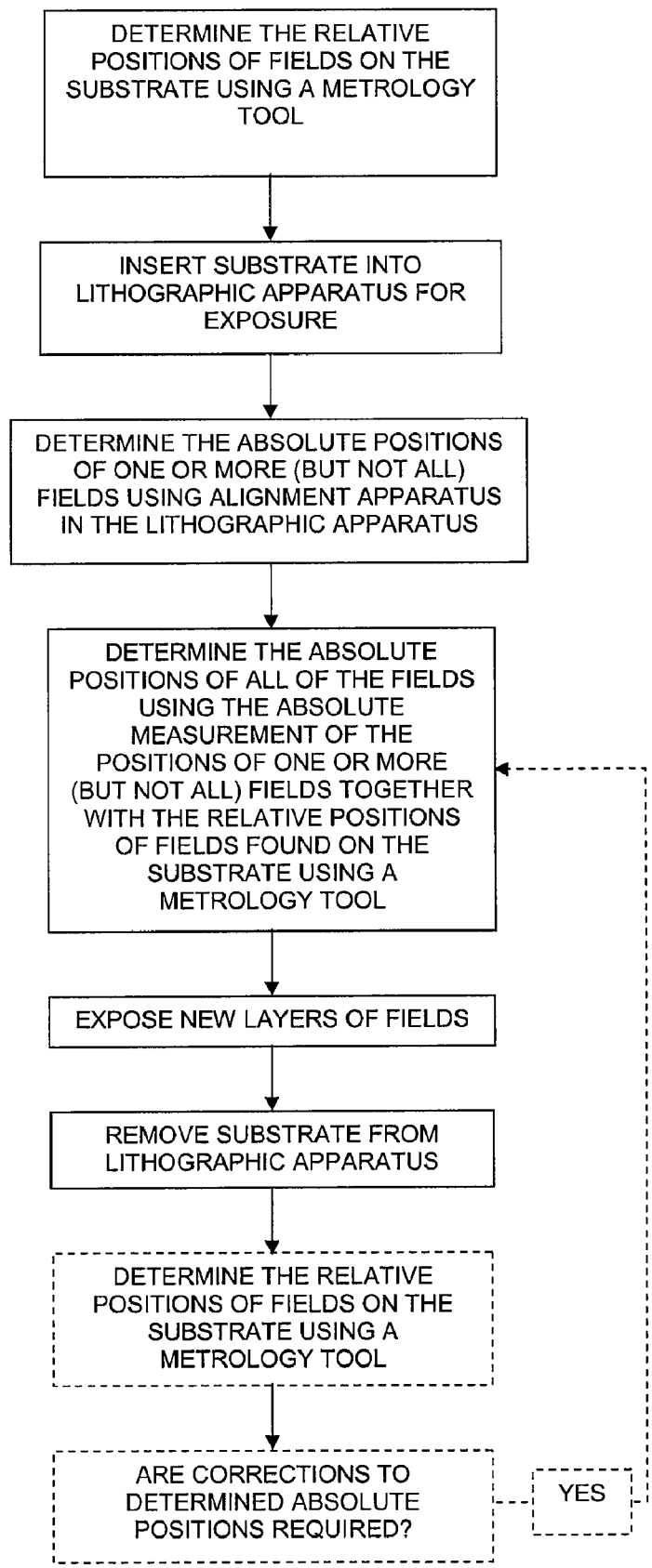
FIG. 7 is a flow chart schematically depicting a method, according to an embodiment of the present invention.

FIG. 7 depicts a flow chart illustrating operating principles of a method according to an embodiment of the present invention. FIG. 7 is an approximate summary of the method described above in relation to FIGS. 3 to 6.

In procedure 700, the relative positions of fields on the substrate using a metrology tool is determined. Then, the method proceeds to procedure 705 where the substrate is inserted into a lithographic apparatus for exposure. Then, the method proceeds to procedure 710 where the absolute position(s) of one or more fields using an alignment apparatus in the lithographic apparatus is/are determined. Then, the method proceeds to procedure 715 where the absolute positions of all the fields using the absolute measurement of the positions of one or more fields together with the relative positions of fields found on the substrate using a metrology tool are determined. Then, the method proceeds to procedure 720 where a new layer of fields is exposed (i.e., new fields are defined). Then, the method proceeds to procedure 725 where the substrate is removed from the lithographic apparatus. Then, the method proceeds to procedure 730 where the relative positions of fields on the substrate using a metrology tool is determined. Then, the method proceeds to procedure 735 where a determination is made as to whether corrections to the determined absolute positions are desired. If the result of the inquiry is positive, then the method proceeds back to procedure 715.

It will be appreciated that the positions of the fields applied to a substrate may be determined absolutely (i.e., with reference to the lithographic apparatus) without having to measure each of their positions individually. Since the positions of the fields are determined absolutely, overlay accuracy is increased. This is in contrast to a conventional method, where changes in the shape and/or orientation of the substrate is usually used to determine any changes that are required in alignment. Since the positions of the fields are determined absolutely without measuring each of their positions individually in the lithographic apparatus, throughput may be increased. This is in contrast to another conventional method, where the absolute position of each field is determined using alignment apparatus in the lithographic apparatus, which may take up a significant amount of time and reduce throughput.

Figure 8:
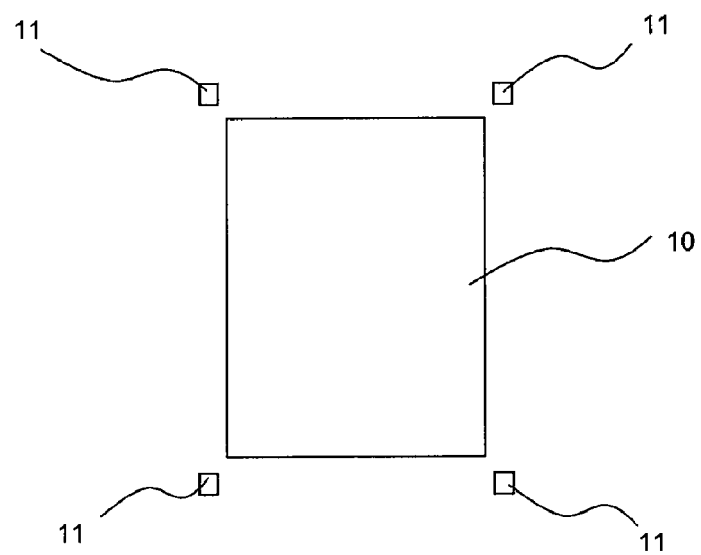
FIGS. 8 and 9 depict field shapes and relative alignments according to an embodiment of the present invention.

When describing FIG. 3, it was stated that the relative positions of fields 1 provided on the substrate W are determined using the metrology tool. This may be achieved in any one of a number of ways. For example, FIG. 8, according to an embodiment of the present invention, shows a field arrangement which may be beneficial in determining the relative position of fields on a substrate. FIG. 8 depicts a field having a main body 10, and alignment marks 11 positioned adjacent to each of the corners of the main body 10.

Figure 9:
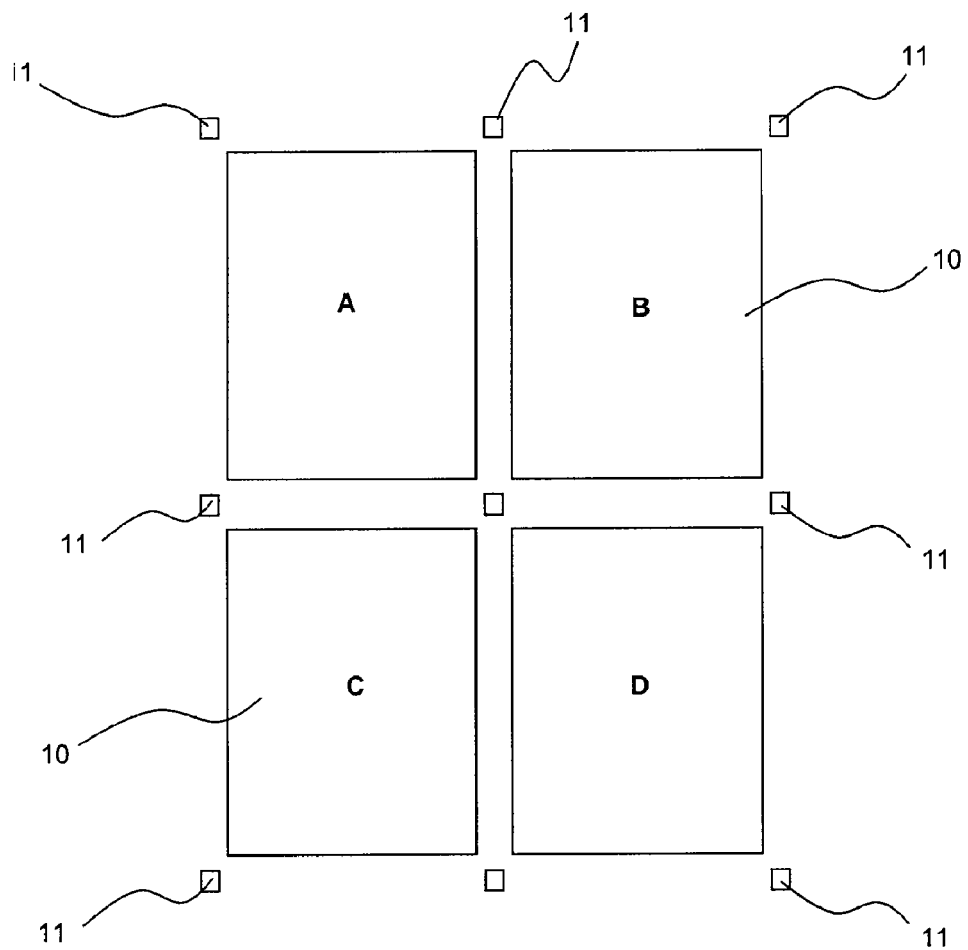

FIG. 9, according to an embodiment of the present invention, shows how the alignment marks 11 may be used to determine or assist in the alignment between adjacent fields applied in or on a single layer (e.g., photo resist). FIG. 9 shows four fields A, B, C, D which have been applied adjacent to one another. It can be seen that the fields A, B, C, D are well aligned since the alignment marks 11 which overlap are overlaid accurately on top of one another. For example, it can be seen that the bottom right hand alignment mark 11 of field A, the bottom left alignment mark 11 of field B, the top right alignment mark 11 of field C, and the top left alignment mark 11 of field D are accurately overlaid on top of one another in the centre of the four fields A, B, C, D.

Figure 10:
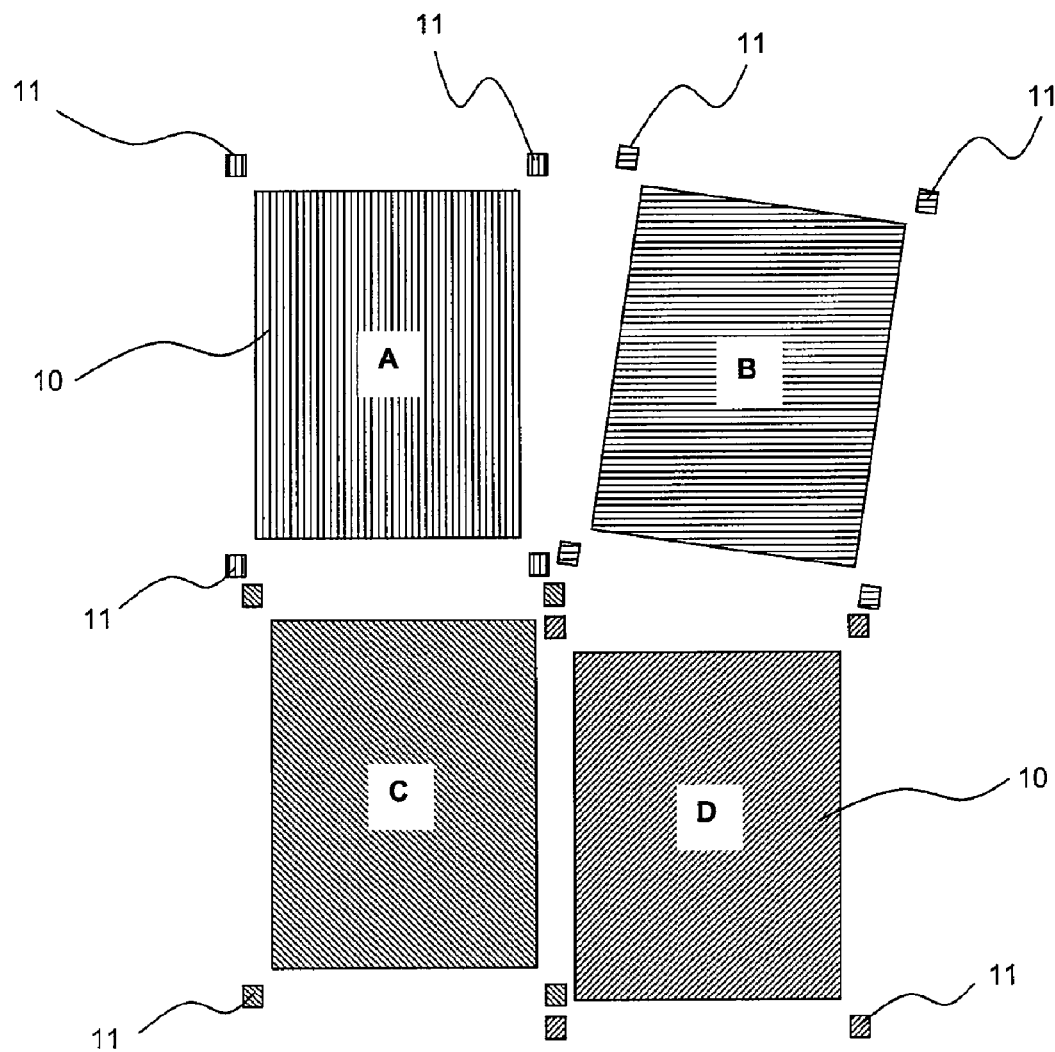
FIG. 10 depicts different alignments of the fields shown in FIGS. 8 and 9, according to an embodiment of the present invention.

FIG. 10, according to an embodiment of the present invention, illustrates a situation where the four fields A, B, C, D are not well aligned. In other words, FIG. 10 shows the four fields A, B, C, D when they are misaligned. The misalignment in the Figure is exaggerated for clarity purposes. Additionally, in the Figure, each of the fields A, B, C, D and their alignment marks 11 have been given a different shading so that they will be more clearly distinguished from one another. The relative positions of the fields A, B, C, D may be accurately determined by, for example determining the spatial differences between the alignment marks 11 of adjacent fields. For example, the shift of the adjacent fields in the x or y directions may be determined by measuring how far away certain alignment marks 11 are in the x and y directions. Furthermore, if the x and y separation of alignment marks is varied between different alignment marks, the relative rotation of adjacent fields may be determined. For example, it can be seen that field B has been rotated clockwise with respect to field A. The degree of this rotation may be readily determined by determining how far the top right alignment mark 11 of field A is from the top left alignment mark of field B, together with the separation between the bottom right alignment mark of field A and the bottom left alignment mark 11 of field B. In some circumstances it may only be desirable to determine whether the fields have been translated in the x and y directions, and if so, to what extent they have been translated. In other examples, it may be desirable to also determine the degree of rotation between adjacent fields, or even a change in shape of the applied fields. A change in shape of the applied fields may, for example, be determined by measuring the distances between the alignments marks 11 of that field.

FIGS. 9 and 10 depict only a single example of a way in which relative positions of fields may be determined. The relative positions may be determined in any one of a number of ways, for example determining the space in between the fields themselves, and not necessarily alignment marks of those fields. Alignment marks of adjacent fields could be configured such that they overlap or coincide with each other. For example, the alignment marks may be gratings. The degree of separation, movement, etc., between adjacent fields may be determined from information derivable from overlapping (or in other words interlaced) gratings. The alignments may vary in form or shape from field to field. For example, adjacent fields may have alignment marks which are gratings of different pitch. Adjacent fields may be provided with smaller and larger box-shaped alignment marks. If the adjacent fields are well aligned, the smaller box of one field will fit inside the larger box of an adjacent field. The use of alignment marks may not be required in some embodiments.

In the above embodiments, the relative positions of previously applied fields on a substrate have been determined. That same substrate is then loaded into a lithographic apparatus, where the absolute positions of a number, but not all, fields are then determined. It will be appreciated that the relative positions of previously applied fields could be obtained from a different (e.g., reference) substrate. That is, some, or even the majority of substrates may not have the relative positions of their applied fields determined. Instead, it may be assumed that the relative positions of the applied fields will be the same for all substrates for a given lithographic apparatus setup (e.g., for a given set of exposure conditions), or in a batch of exposed substrates.

It will be appreciated that in order to determine the absolute positions of all fields on a substrate, at least one of the fields whose relative position is determined (e.g., a 'first' field) also needs to have its absolute position determined using the alignment apparatus in the lithographic apparatus. This is needed to give the other relative positional relationships some context, or in other words a reference from which absolute positions may be inferred or determined.

The applied fields may be used to form at least a part of a device, for example part of an integrated circuit, or electrical component or the like. Devices or parts of devices that include multiple layers may be constructed or fabricated more accurately and/or reliably using the method described above. The invention may also be relevant in the field of double patterning, where patterns are applied in succession next to each other to increase the over resolution of the pattern.

While specific embodiments of the invention have been described above, it will be appreciated that the invention may be practiced otherwise than as described, for example, the invention is equally applicable to imprint lithography. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
   determining relative positional relationships between fields on a substrate, one of the fields including a first field;
   obtaining at least one absolute positional relationship between a position of at least the first field of the substrate and a part of a lithographic apparatus using an alignment apparatus; and
   determining an absolute positional relationship between at least one field, other than the first field, and the part of the lithographic apparatus using the relative positional relationships and the at least one obtained absolute relationship.

2. The method of claim 1, wherein the determining relative positional relationships between fields on a substrate comprises determining the relative positional relationships between a majority of fields on a substrate.

3. The method of claim 1, wherein the determining relative positional relationships between fields on a substrate comprises determining the relative positional relationships between all fields on a substrate.

4. The method of claim 1, wherein the relative positional relationships are determined remote from of the lithographic apparatus.

5. The method of claim 4, wherein the relative positional relationships are determined using a metrology tool remotely located with respect to the lithographic apparatus.

6. The method of claim 1, wherein a degree of overlap of, or separation between, at least parts of different fields in a layer provided on the substrate is used to determine the relative positional relationships.

7. The method of claim 1, further comprising obtaining a plurality of absolute positional relationships between the positions of a plurality of fields and a part of the lithographic apparatus using the alignment apparatus.

8. The method of claim 7, wherein each of the plurality of fields is selected such that each of the plurality of fields is no more than one field spaced away from another one of the plurality of fields.

9. The method of claim 1, comprising determining an absolute positional relationship between a majority of fields, other than the first field, and the part of the lithographic apparatus using the relative positional relationships and the at least one obtained absolute positional relationship.

10. The method of claim 1, comprising determining an absolute positional relationship between all fields other than the first field and the part of the lithographic apparatus using the relative positional relationships and the at least one obtained absolute positional relationship.

11. The method of claim 1, further comprising defining one or more additional fields on top of the fields, based on the determined absolute positional relationships of the fields.

12. The method of claim 11, further comprising determining relative positional relationships between the additional fields.

13. The method of claim 12, wherein the relative positional relationships between the additional fields are remotely determined with respect to the lithographic apparatus.

14. The method of claim 12, wherein the relative positional relationships between the additional fields are determined using a metrology tool remotely located with respect to the lithographic apparatus.

15. The method of claim 12, further comprising determining whether the relative positions between the additional fields correspond to the determined absolute positions.

16. The method of claim 15, further comprising determining a correction factor indicative of any difference between the relative positions of the additional fields and the determined absolute positions.

17. The method of claim 16, further comprising, in a subsequent application of a field, determining the absolute position of the fields based on the correction factor.

18. A method, comprising:
- determining relative positional relationships between fields on a substrate, one of the fields including a first field;
- obtaining at least one absolute positional relationship between a position of at least the first field of the substrate and a part of a lithographic apparatus using an alignment apparatus;
- determining an absolute positional relationship between at least one field, other than the first field, and a part of the lithographic apparatus using the relative positional relationships and the at least one obtained absolute relationship; and
- defining an additional field on the substrate based on the determined absolute positions of the applied fields.

* * * * *